(12) United States Patent
Knoedl, Jr.

(10) Patent No.: US 6,307,252 B1
(45) Date of Patent: Oct. 23, 2001

(54) ON-CHIP SHIELDING OF SIGNALS

(75) Inventor: George Knoedl, Jr., Milford, NJ (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/263,445

(22) Filed: Mar. 5, 1999

(51) Int. Cl.$^7$ .................. H01L 23/552; H01L 27/10; H01L 29/93; H01L 39/00; H01L 23/48

(52) U.S. Cl. .................. 257/659; 257/208; 257/211; 257/508; 257/660; 257/662; 257/758

(58) Field of Search .................. 257/208, 211, 257/630, 659, 660, 662, 758, 775, 776, 508; 438/118, 128, 129, 619, 622, 348, 361

(56) References Cited

U.S. PATENT DOCUMENTS

| | | | |
|---|---|---|---|
| 4,514,749 | 4/1985 | Shoji | 257/664 |
| 4,958,222 | * 9/1990 | Takakura et al. | 257/659 |
| 5,663,677 | 9/1997 | Freyman et al. | 327/565 |

FOREIGN PATENT DOCUMENTS

402082531 * 3/1990 (JP) .

* cited by examiner

Primary Examiner—Steven Loke
Assistant Examiner—Hung K. Vu
(74) Attorney, Agent, or Firm—Steve Mendelsohn

(57) ABSTRACT

The conductor for a given signal in an integrated circuit (IC) is shielded from electromagnetic coupling with one or more other, potentially noisy on-chip signals by shielding structure that essentially surrounds the signal conductor in a Faraday cage. In one embodiment, the signal conductor lies in the outermost metal layer in the IC. In that case, the shielding structure is a pair of adjacent shielding conductors lying on either side of the signal conductor within the outermost metal layer and a subtending shielding conductor lying in a metal layer below the signal conductor and the two adjacent conductors, where the subtending conductor is electrically connected to each of the adjacent conductors via interlevel interconnects, but there are no active components in the IC that draw current from the shielding conductors. When configured for signal processing, the three shielding conductors are connected either directly or indirectly to a quiet external reference. Such a shielding configuration effectively isolates the given signal carried by the signal conductor from other signals in the IC, thereby effectively protecting the given signal from being corrupted by coupled or induced noise.

14 Claims, 2 Drawing Sheets

ON-CHIP SHIELDING OF SIGNALS

BACKGROUND OF THE INVENTION

1. Field of the Invention

The present invention relates to electronics, and, in particular, to integrated circuitry.

2. Description of the Related Art

Integrated circuits are used for a wide variety of applications. For example, part of an integrated circuit (IC) can be designed to function as a decoder of information encoded into a received analog signal. What we commonly think of as digital signals are, in reality, analog signals that represent the digital information. In order to decode the information, the processing of the received signal may include one or more thresholding steps in which the magnitude of a signal is compared with a DC reference voltage signal that should ideally be noise-free. The analog reference signal is typically acquired from off-chip and is bused throughout the chip as needed for the decode processing. As the analog reference signal is bused throughout the chip, it may be exposed to electromagnetic coupling with other, possibly noisy signals that are also present on the chip. This electromagnetic coupling can induce noise in the analog reference signal, which may adversely affect the accuracy of the thresholding steps, thereby leading to errors in the decode processing.

One way to reduce such noise in the analog reference signal is to design the layout of the IC such that the conductor for the analog reference signal is sandwiched between layers containing existing structure designed to carry the power Vdd (i.e., the power rail) and the power ground Vss (i.e., the ground rail) for the IC. This solution effectively shields the analog reference signal from noise from signals on the opposite sides of the power and ground rails, but the shielding structure itself is not sufficiently quiet. Although, ideally, the power signal Vdd and the ground signal Vss should be perfectly constant, noise-free signals that are provided by quiet external sources, in reality, there is a tendency of the potentials on the power and ground rails to change as other components on the IC draw current from those rails, due to the finite impedance of those rails, their packaging parasitics, and their corresponding external sources. This phenomenon, which is referred to as ground bounce, can lead to an unacceptably high level of noise in the analog reference signal as a result of electromagnetic coupling between the signal conductor and the noisy power and/or ground rails.

SUMMARY OF THE INVENTION

The present invention is directed to a technique for shielding a given signal in an integrated circuit from noise induced by one or more other on-chip signals. According to the present invention, the conductor used to carry the given signal is surrounded on at least three sides by shielding conductors that effectively isolate the given signal from coupling with other noisy on-chip signals, where no current is drawn from the shielding conductors as a result of direct connection to any active on-chip components. The present invention provides sufficiently quiet shielding of a given signal, thereby effectively isolating it from noise induced by electromagnetic coupling with other on-chip signals.

In one embodiment, the present invention is an integrated circuit comprising (a) a signal conductor lying in a first metal layer in the IC and configured to carry a given signal; (b) a pair of adjacent shielding conductors in the first metal layer, lying on either side of and running parallel to the signal conductor; and (c) a subtending shielding conductor, lying below the signal conductor and the pair of adjacent shielding conductors, in a second metal layer in the IC immediately below the first metal layer, wherein the three shielding conductors isolate the given signal in the signal conductor from electromagnetic coupling with one or more other signals in the IC.

BRIEF DESCRIPTION OF THE DRAWINGS

Other aspects, features, and advantages of the present invention will become more fully apparent from the following detailed description, the appended claims, and the accompanying drawing(s) in which

DETAILED DESCRIPTION

Figure 1:
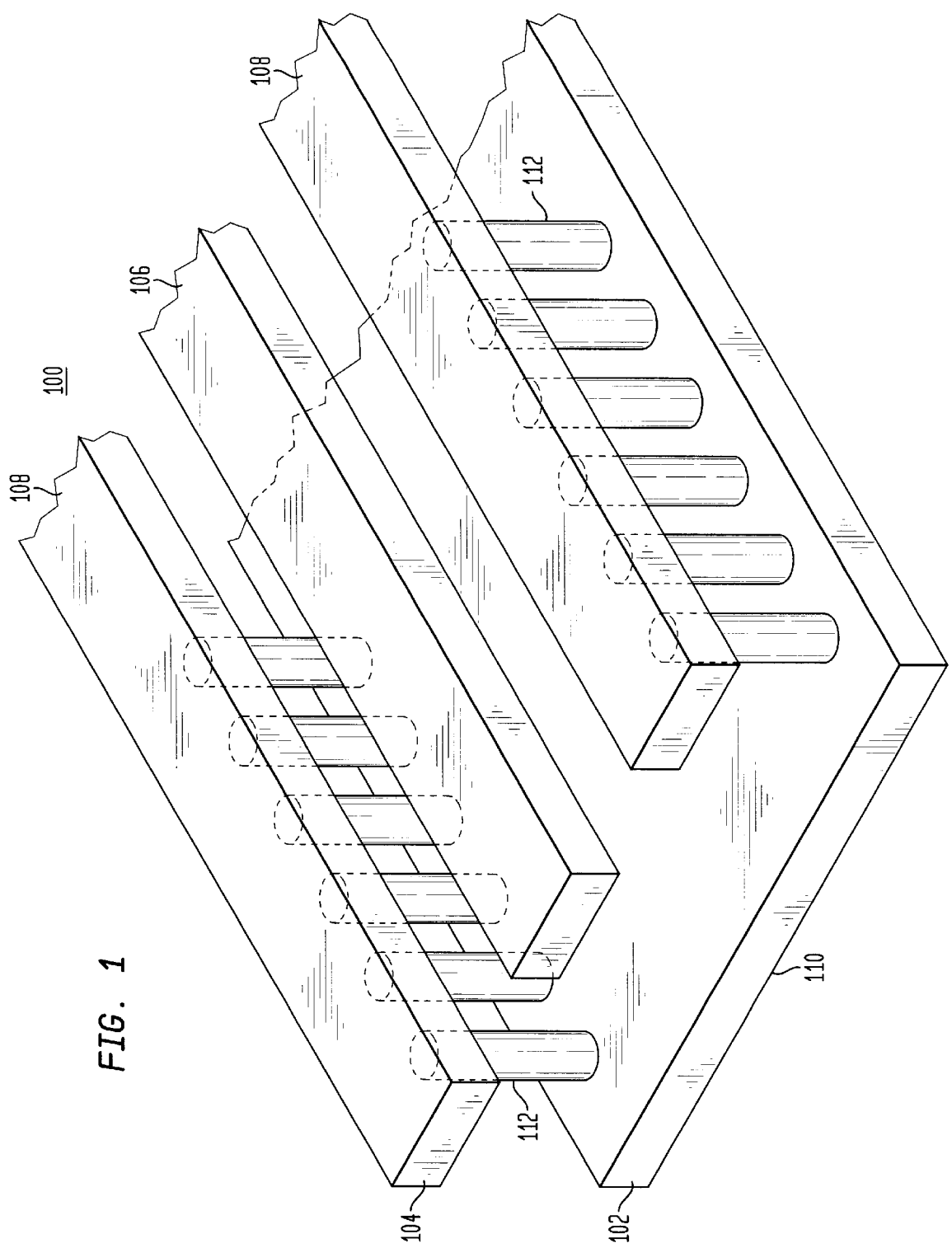
FIG. 1 shows a schematic diagram of the shielding technique according to one embodiment of the present invention.

FIG. 1 shows a schematic diagram of a shielding configuration for a given signal, according to one embodiment of the present invention. FIG. 1 shows some of the structure in two adjacent metal layers (metal layer 3 102 and metal layer 4 104) of an integrated circuit 100, where metal layer 4 104 is preferably the outermost metal layer in IC 100. Metal layers 1 and 2 of IC 100 are not shown in FIG. 1. The conductor 106 for the given signal to be shielded lies in metal layer 4 104 between two adjacent shielding conductors 108 that run parallel to signal conductor 106. A subtending shielding conductor 110 lies in metal layer 3 102 below both signal conductor 106 and adjacent conductors 108. Interlevel interconnects 112 preferably provide multiple electrical connections using via holes between subtending conductor 110 and each adjacent conductor 108. Other than being interconnected to each other by interconnects 112, none of the three shielding conductors are electrically connected to any active components in IC 100. As used in this specification, the term "active components" does not cover the return of a signal termination at the destination end of a shielding conductor for those configurations in which the destination ends of the signal conductor 106 and the shielding conductor are connected to opposite sides of the signal termination.

In one implementation, typical dimensions are 0.5 $\mu$m to 0.8 $\mu$m for the thickness of metal layers 102 and 104, 0.7 $\mu$m to 1.0 $\mu$m for the thickness of the dielectric layer between the metal layers, and 0.4 $\mu$m to 1.0 $\mu$m for both the width of and spacing between signal conductor 106 and adjacent conductors 108.

In general, when IC 100 is configured for signal processing, at least one of the three shielding conductors in FIG. 1 is directly connected to a quiet external reference, which may be—but need not be—ground. In one embodiment, only one of the shielding conductors is connected to the quiet external reference and that connection exists at only one end of the shielding conductor. In another embodiment, all of the shielding conductors are directly connected at each end, respectively, to the return of the signal source at its source end and to the return of the signal termination at its destination. Still other embodiments involve different possible configurations of the shielding conductors being directly connected to the quiet external reference at one or both ends. In all of these embodiments, due to the presence of interconnects 112, all three shielding conductors are either directly or indirectly connected to the quiet external reference.

With the three shielding conductors in FIG. 1 connected to a quiet external reference either directly or indirectly in any of these different possible embodiments, the shielding conductors isolate a given signal carried by signal conductor 106 from electromagnetic coupling from one or more other, potentially noisy signals that may exist elsewhere in IC 100. The shielding configuration in FIG. 1 essentially operates to place signal conductor 106 within a Faraday cage. In addition to providing the electrical connection between subtending conductor 110 and each adjacent conductor 108, interconnects 112 effectively provide additional shielding conductor that inhibits electromagnetic field lines from "squeezing" between the two layers of shielding conductor, thereby increasing the isolation of the given signal carried in signal conductor 106 from other on-chip signals.

In the embodiment shown in FIG. 1, the signal conductor lies in an outermost metal layer in the integrated circuit (i.e., metal layer 4 104), where the outermost metal layer is the metal layer furthest from the IC substrate. In that case, effective shielding is achieved by placing shielding conductors on the three sides of signal conductor 106 shown in FIG. 1, since there are no on-chip signals on the unshielded fourth side of the signal conductor. In alternative embodiments, the signal conductor may be formed within an internal metal layer (i.e., below the outermost metal layer). In those cases, in order to provide satisfactory noise isolation from all other signals in the IC, the shielding configuration may need to include a fourth shielding conductor similar to subtending conductor 110 of FIG. 1, but located in the adjacent metal layer above rather than in the adjacent metal layer below the layer containing the signal conductor. That fourth shielding conductor would preferably be connected to the adjacent shielding conductors via interlevel interconnects in a manner similar to the multiple interconnects 112 that connect subtending conductor 110 and the two adjacent conductors 108 in IC 100.

Figure 2:
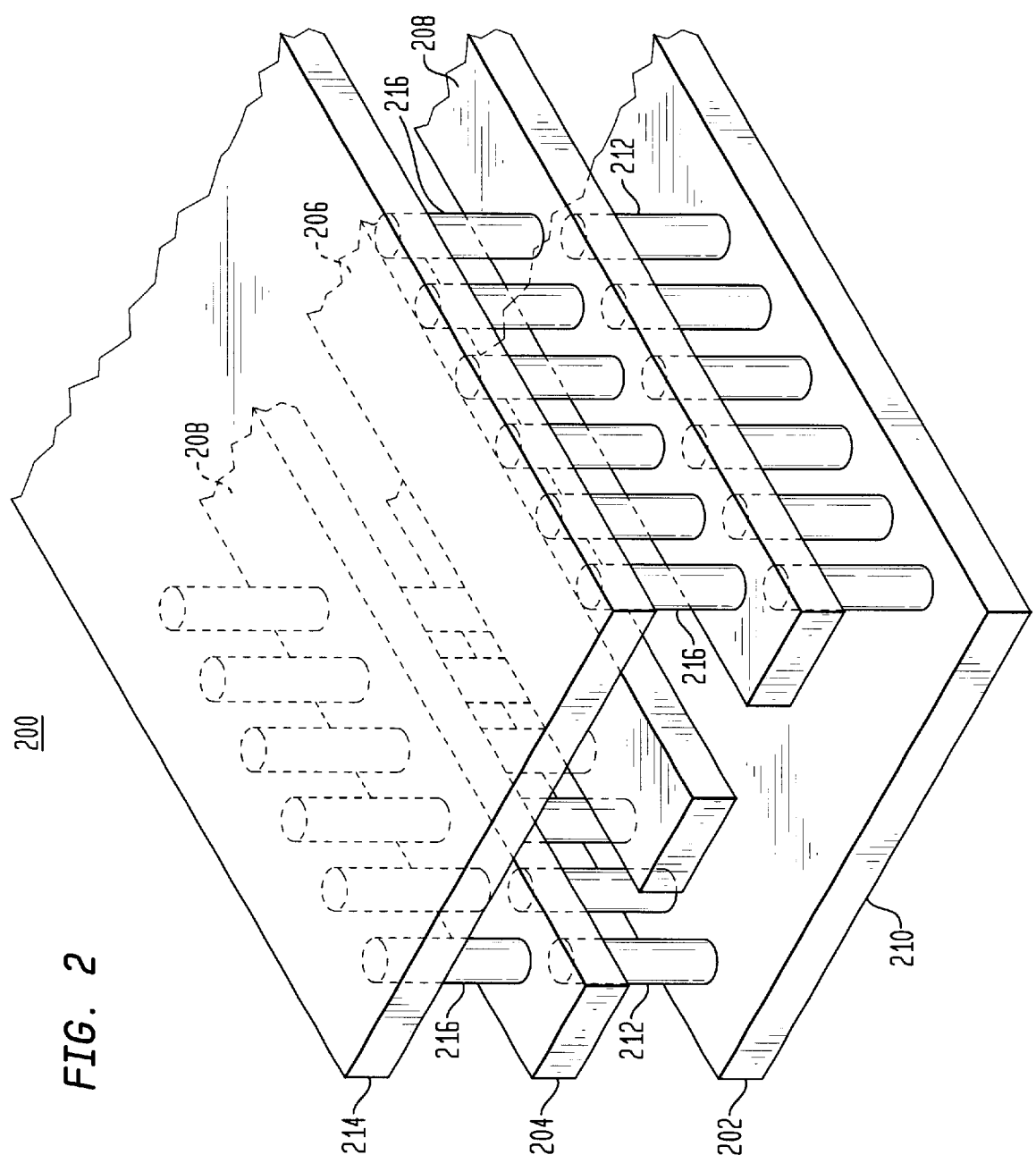
FIG. 2 shows a schematic diagram of the shielding technique according to another embodiment of the present invention.

FIG. 2 shows a schematic diagram of the alternative embodiment described in the previous paragraph. In addition to elements 202–212, which are analogous to elements 102–112 in IC 100 of FIG. 1, IC 200 of FIG. 2 has a fourth shielding conductor 214 and interlevel connects 216 connecting the fourth shielding conductor 214 to the two adjacent shielding conductors 208.

The given signal that is shielded by the present technique is illustratively described as a reference voltage signal. Other types of signals are possible. For example, analog and digital signals carrying data, clocks, or other types of information may benefit from the present invention.

It will be further understood that various changes in the details, materials, and arrangements of the parts which have been described and illustrated in order to explain the nature of this invention may be made by those skilled in the art without departing from the scope of the invention as expressed in the following claims.

What is claimed is:

1. An integrated circuit (IC) comprising:
   (a) a signal conductor lying in a first metal layer in the IC and configured to carry a given signal;
   (b) a pair of adjacent shielding conductors in the first metal layer, lying on either side of and running parallel to the signal conductor; and
   (c) a subtending planar shielding conductor, lying directly below the signal conductor and the pair of adjacent shielding conductors, in a second metal layer in the IC immediately below the first metal layer, wherein the three shielding conductors isolate the given signal in the signal conductor from electromagnetic coupling with one or more other signals in the IC, wherein:
      each shielding conductor is directly connected to a return of a signal source at a source end of the shielding conductor and to a return of a signal termination at a destination end of the shielding conductor; and
      the destination end of the shielding conductor is different from the source end of the shielding conductor.

2. The invention of claim 1, wherein each adjacent shielding conductor is electrically connected to the subtending planar shielding conductor by a plurality of interlevel interconnects.

3. The invention of claim 1, wherein the first metal layer is the outermost metal layer in the IC.

4. The invention of claim 1, wherein the first metal layer is not the outermost metal layer in the IC and further comprising an additional planar shielding conductor lying directly above the signal conductor and the pair of adjacent shielding conductors in a third metal layer in the IC immediately above the first metal layer.

5. The invention of claim 4, wherein each adjacent shielding conductor is electrically connected to the additional planar shielding conductor by a plurality of interlevel interconnects.

6. The invention of claim 1, wherein none of the three shielding conductors are electrically connected to any active component in the IC.

7. The invention of claim 1, wherein no active component in the IC is configured to draw current from any of the shielding conductors.

8. The invention of claim 1, wherein, when the IC is configured for signal processing, at least one of the shielding conductors is electrically connected to a quiet external reference.

9. The invention of claim 8, wherein the quiet external reference is ground.

10. The invention of claim 8, wherein each of the three shielding conductors is electrically connected either directly or indirectly to the quiet external reference at either one or both ends of the shielding conductor.

11. The invention of claim 1, wherein:
   each adjacent shielding conductor is electrically connected to the subtending planar shielding conductor by a plurality of interlevel interconnects;
   none of the three shielding conductors are electrically connected to any active component in the IC;
   no active component in the IC is configured to draw current from any of the shielding conductors;
   when the IC is configured for signal processing, at least one of the shielding conductors is electrically connected to a quiet external reference, wherein the quiet external reference is ground; and each of the three shielding conductors is electrically connected either directly or indirectly to the quiet external reference at either one or both ends of the shielding conductor.

12. The invention of claim 11, wherein the first metal layer is the outermost metal layer in the IC.

13. The invention of claim 11, wherein the first metal layer is not the outermost metal layer in the IC and further comprising an additional planar shielding conductor lying directly above the signal conductor and the pair of adjacent shielding conductors in a third metal layer in the IC immediately above the first metal layer, wherein each adjacent shielding conductor is electrically connected to the additional planar shielding conductor by a plurality of interlevel interconnects.

14. The invention of claim 1, wherein the given signal is a reference voltage signal.

* * * * *